United States Patent [19]
Akimoto

[11] Patent Number: 5,942,013
[45] Date of Patent: Aug. 24, 1999

[54] SUBSTRATE PROCESSING SYSTEM

[75] Inventor: Masami Akimoto, Kumamoto, Japan

[73] Assignee: Tokyo Electron Limited, Tokyo, Japan

[21] Appl. No.: 08/928,023

[22] Filed: Sep. 11, 1997

[30] Foreign Application Priority Data

Sep. 13, 1996 [JP] Japan ..................................... 8-265329

[51] Int. Cl.[6] .............................. B05D 3/12; B05C 13/00
[52] U.S. Cl. .......................................... 29/25.01; 414/217
[58] Field of Search ............................. 29/25.01; 414/217

[56] References Cited

U.S. PATENT DOCUMENTS

| | | |
|---|---|---|
| 5,030,057 | 7/1991 | Nishi et al. . |
| 5,442,416 | 8/1995 | Tateyama et al. . |
| 5,562,383 | 10/1996 | Iwai et al. . |
| 5,580,607 | 12/1996 | Takekuma et al. . |
| 5,611,655 | 3/1997 | Fukasawa et al. . |
| 5,626,675 | 5/1997 | Sakamoto et al. . |
| 5,626,913 | 5/1997 | Tomoeda et al. . |
| 5,700,127 | 12/1997 | Harada et al. . |
| 5,718,763 | 2/1998 | Tateyama et al. . |
| 5,844,662 | 12/1998 | Akimoto et al. . |

FOREIGN PATENT DOCUMENTS 2559617   9/1996   Japan .

*Primary Examiner*—David Graybill
*Attorney, Agent, or Firm*—Oblon, Spivak, McClelland, Maier & Neustadtd, P.C.

[57] ABSTRACT

A substrate processing system comprises a cassette mounting section having a plurality of cassettes arranged therein, a sub-arm mechanism for transferring the substrate into and out of the cassette within the cassette mounting section, a first transfer path of the sub-arm mechanism extending along the arrangement of the cassettes in the cassette mounting section, a process section including a heat treating section for heating or cooling the substrate and a liquid treating section in which a process liquid is applied to the substrate, a main arm mechanism for transfer of the substrate from and onto the sub-arm mechanism and from and into the process section, and a second transfer path of the main arm mechanism. The heat treating section is positioned higher than the first transfer path, interposed between the cassette mounting section and the second transfer path in respect of a horizontal plane, and comprises a plurality of compartments stacked one upon the other.

15 Claims, 8 Drawing Sheets

SUBSTRATE PROCESSING SYSTEM

BACKGROUND OF THE INVENTION

The present invention relates to a substrate processing system in which substrates such as semiconductor wafers are successively transferred into various processing device by plural arm mechanisms and, then, applying process liquid to the substrate and, heat treating the substrate.

A substrate processing system, in which semiconductor wafers are successively coated with a resist solution and, then, the coated resist is developed, is used in a photolithography process. A substrate processing system of this type is disclosed in, for example, U.S. patent applications Ser. Nos. 08/667,712 and 08/686,707.

FIG. 1 shows a conventional substrate processing system 101. As shown in the drawing, the system 101 comprises various processing devices 111 to 117, arm mechanisms 103, 104, 106, and a load/unload section 102. A semiconductor wafer W is taken out by the sub-arm mechanism 103 from a cassette C arranged in the load/unload section 102, delivered from the sub-arm mechanism 103 onto the first main arm mechanism 104 and, then, transferred successively by the first and second main arm mechanisms 104, 106 into the processing devices 111 to 117. After various processing in these devices 111 to 117, the wafer W is brought back into the cassette C.

The conventional substrate processing system 101 occupies a large floor area, making it necessary to use a large clean room housing the system 101. Naturally, the burden given to the air conditioning facilities is increased for supplying a down-flow air stream within the clean room.

Also, in the conventional processing system 101, a transfer path 105 within the load/unload section 102 extends to intersect at right angles with a transfer path 107 within a process section 110 within an XY plane. To be more specific, the transfer path 105 for the sub-arm mechanism 103 extends in an X-axis direction, with the transfer path 107 for the main arm mechanism 104 extending in a Y-axis direction. In other words, these transfer paths 105 and 107 are arranged to form a T-shaped passageway. It follows that it is absolutely necessary for each of the sub-arm mechanism 103 and the main arm mechanism 104 to transfer the wafer W through a crossing 109 of the T-shaped passageway, with the result that an unduly long time is required for the delivery of the wafer W between the arm mechanisms 103 and 104.

BRIEF SUMMARY OF THE INVENTION

An object of the present invention is to provide a miniaturized substrate processing system, which requires a small floor area, permits transferring the substrate in a short time, and achieves a high throughput.

According to a first aspect of the present invention, there is provided a substrate processing system, comprising:

a cassette mounting section having a plurality of cassettes arranged therein;

a sub-arm mechanism for transferring the substrate into and out of the cassette within the cassette mounting section;

a first transfer path of the sub-arm mechanism extending along the arrangement of the cassettes in the cassette mounting section;

a process section including a heat treating section for heating and cooling the substrate and a liquid treating section in which a process liquid is applied to the substrate;

a main arm mechanism for transferring the substrate from and onto the sub-arm mechanism and for transferring the substrate from and into the process section; and a second transfer path of the main arm mechanism, wherein the heat treating section is positioned higher than the first transfer path, interposed between the cassette mounting section and the second transfer path in respect of a horizontal plane, and comprises a plurality of compartments stacked one upon the other.

In the processing system of the present invention, a heat treating section is arranged above the first transfer path for the sub-arm mechanism, leading to a small floor area. As a result, the clean room housing the processing system can be made smaller than in the past so as to lessen the burden given to the air conditioning facilities for the clean room.

Also, the first and second transfer paths are arranged in parallel with each other, making it possible to deliver the substrate from the sub-arm mechanism onto the main arm mechanism anywhere on the first and second transfer paths. As a result, the moving distance for each of the sub-arm mechanism and the main arm mechanism can be shortened, leading to a shortened transfer time of the substrate.

Further, since the first transfer path is arranged in parallel with the second transfer path, the delivering point of the substrate can be optionally determined to permit the substrate to be transferred in the shortest time.

What should also be noted is that, since the liquid treating section is isolated from the heat treating section by the second transfer path, the liquid treating section is unlikely to be adversely affected by the heat treating section. Further, the liquid treating section is isolated from the cassette mounting section by the first and second transfer paths, the liquid treating section is unlikely to be adversely affected by the cassette mounting section. For example, particles or alkaline substances are prevented from entering the liquid treating section.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
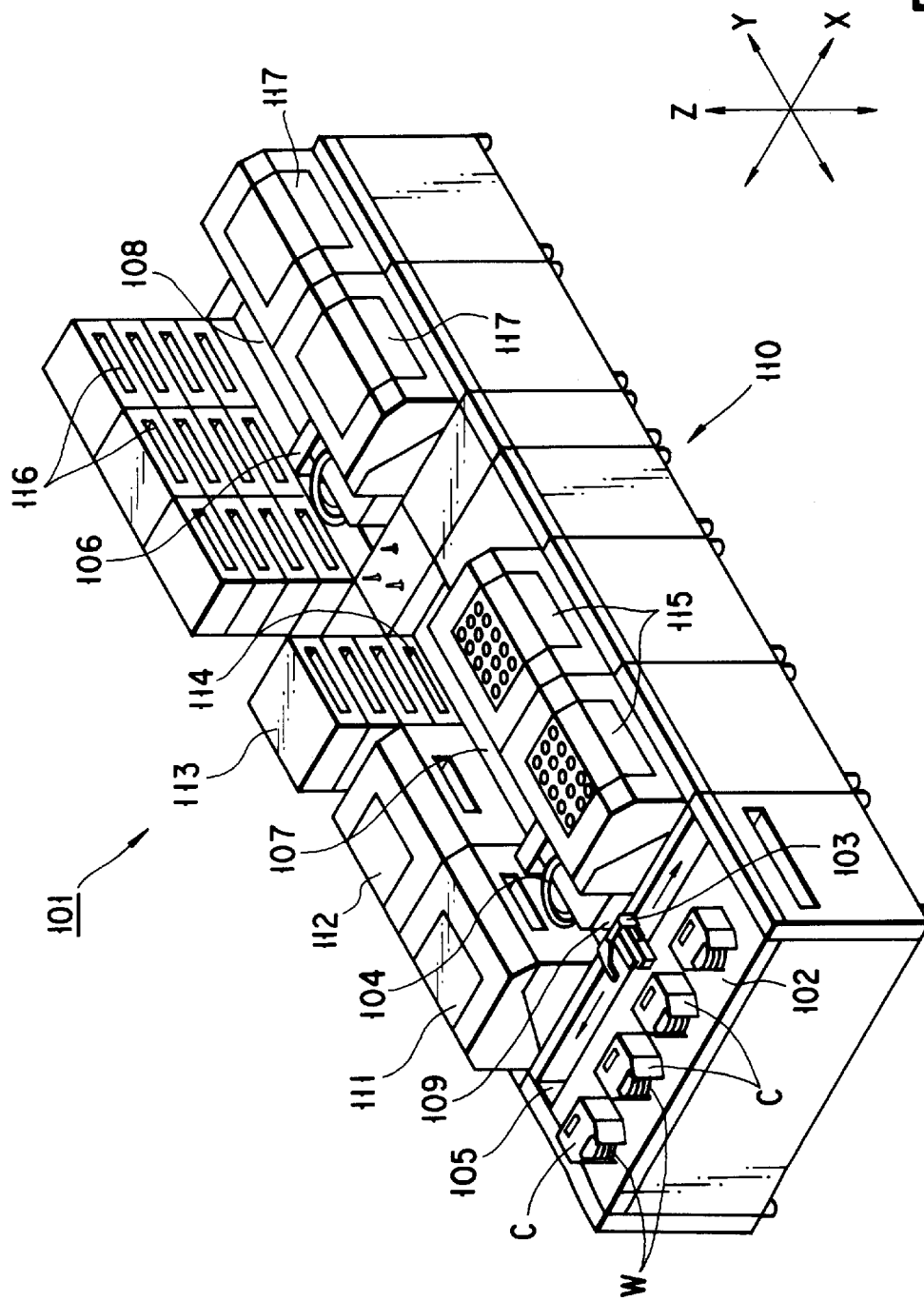
FIG. 1 is an oblique view showing the outer appearance of a conventional substrate processing system.

Let us describe preferred embodiments of the present invention with reference to the accompanying drawings. First of all, FIGS. 2 to 4 collectively show a substrate processing system 1 according to a first embodiment of the present invention.

As shown in the drawings, the substrate processing system 1 comprises a cassette mounting section 10, a first transfer zone 20, a heat treating section 30, a second transfer zone 50, a liquid treating section 60, and an interface section 70. A first transfer path 22 extending in an X-axis direction is formed in the first transfer zone 20. A sub-arm mechanism 21 is movable along the first transfer path 22. The sub-arm mechanism 21 is equipped with a holder 21a for holding a semiconductor wafer W, a driving means for moving the holder 21a back and forth, a driving means for moving the holder 21a in a vertical direction, and a driving means for swinging the holder 21a about a Z-axis. The sub-arm mechanism 21 is also equipped with an alignment mechanism (not shown) for aligning the wafer W so as to accurately locate the wafer W within the treating device.

A second transfer path 57 extending in an X-axis direction is formed in the second transfer zone 50. A main arm mechanism 51 is movable along the second transfer path 57. The main arm mechanism 51 is equipped with three holders 52, 53, 54 for holding the wafer W, a driving means for moving these holders 52, 53, 54 back and forth, a driving means for moving these holders in a vertical direction, and a driving means for swinging these holders about a Z-axis.

Four cassettes C are arranged in an X-axis direction in the cassette mounting section 10. The wafer W is taken one by one out of the cassette C by the sub-arm mechanism 21. Then, the wafer W is delivered from the sub-arm mechanism 21 onto the main arm mechanism 51 in the second transfer zone 50.

The heat treating section 30, the liquid treating section 60 and the interface section 70 are arranged to surround the second transfer zone 50. The main arm mechanism 51 and the second transfer path 57 are arranged in the second transfer zone 50, which is interposed between the heat treating section 30 and the liquid treating section 60.

The heat treating section 30 is located in front of the second transfer zone 50 within an XY plane, i.e., is interposed between the second transfer zone 50 and the cassette mounting section 10. On the other hand, the liquid treating section 60 is located behind the second transfer zone 50 within the XY plane. Further, the interface section 70 is located sidewards of the second transfer zone 50 and joined to a light-exposure section (not shown).

Figure 2:
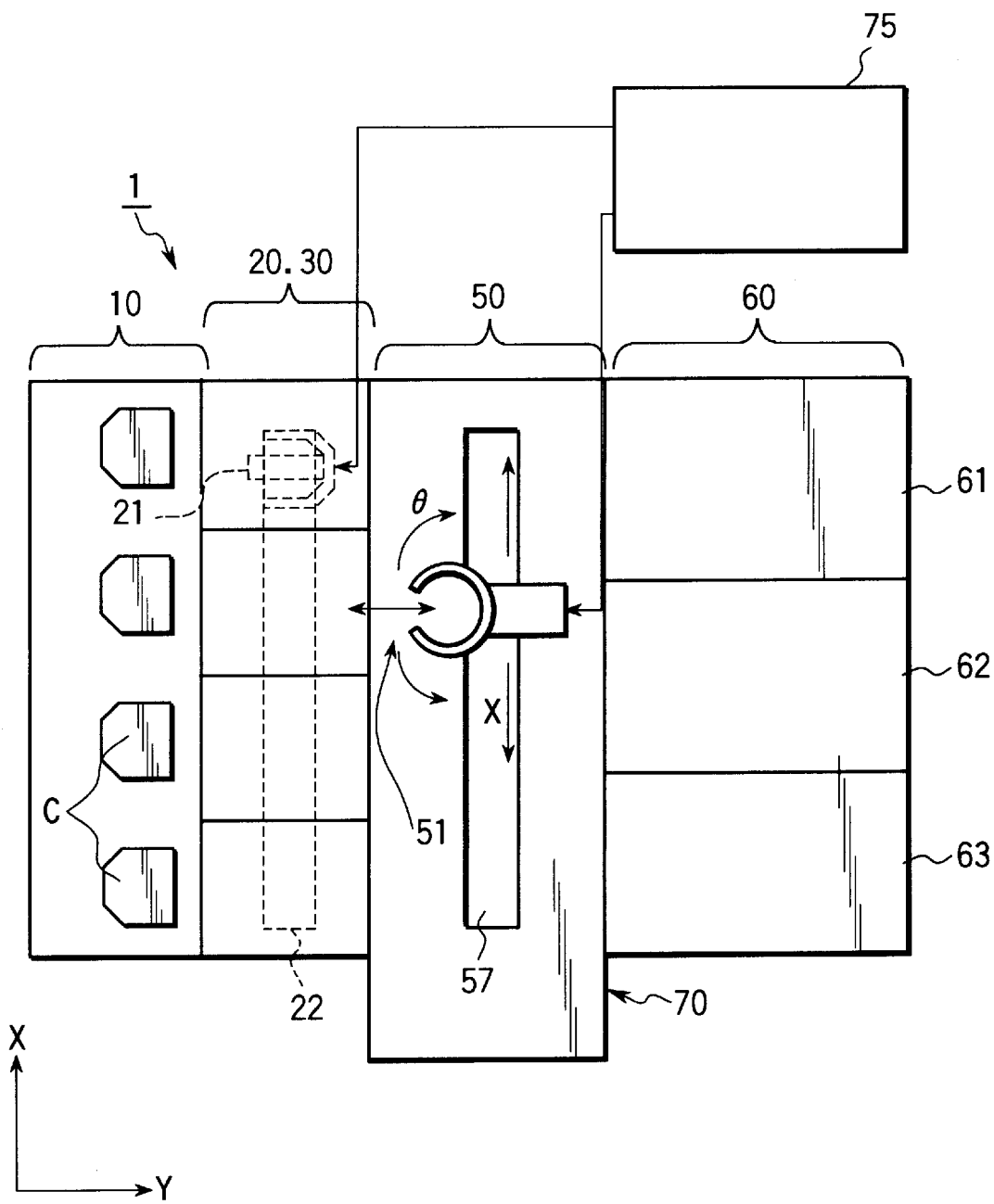
FIG. 2 is a plan view showing a substrate processing system according to a first embodiment of the present invention.

As shown in FIG. 2, the first transfer path 22 and the second transfer path 57 extend in parallel in an X-axis direction. Also, the cassettes C in the cassette mounting section 10 are arranged parallel with the arrangement of the heat treating devices forming the section 30.

Figure 3:
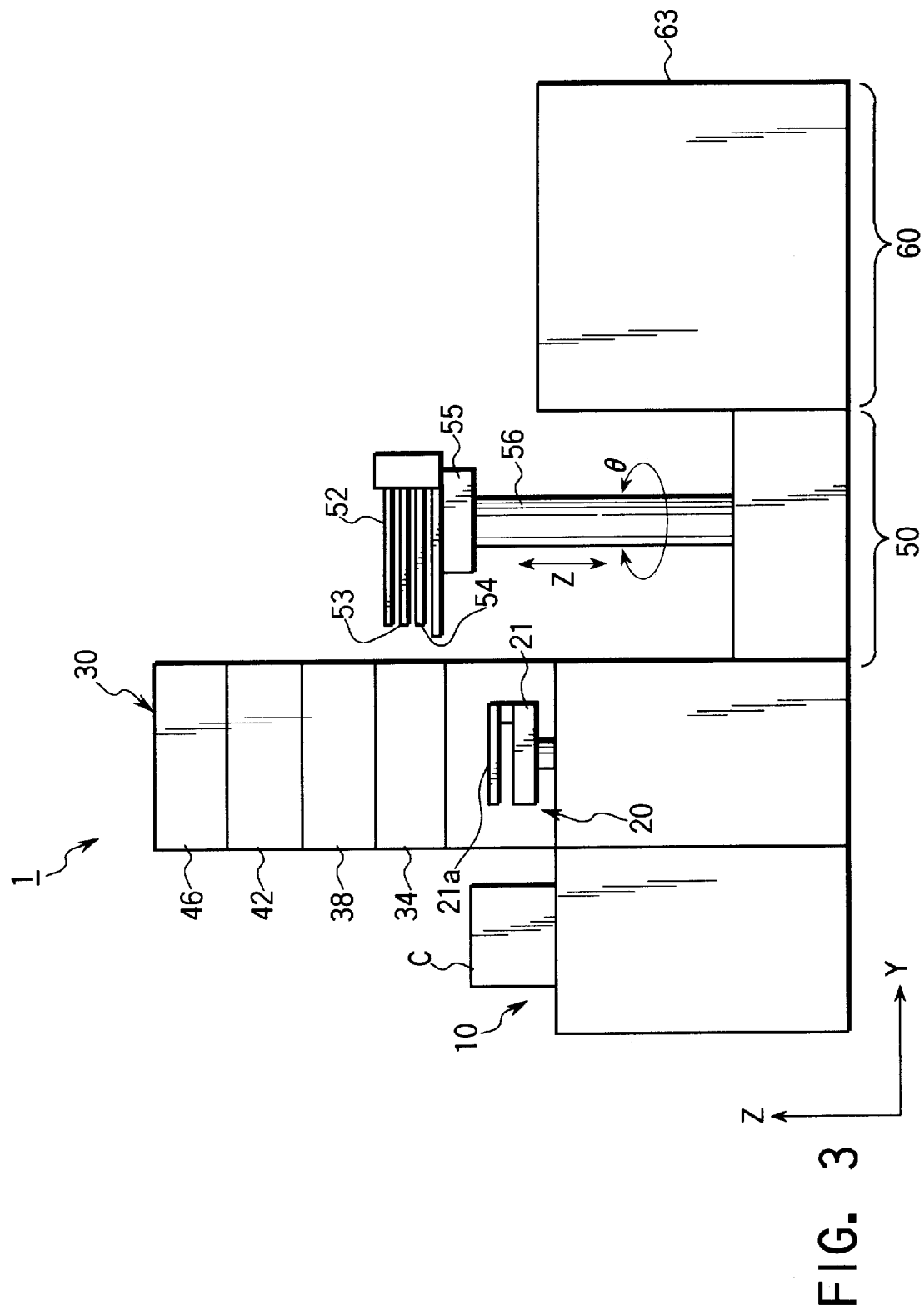
FIG. 3 is a side view showing the substrate processing system according to the first embodiment of the present invention.
Figure 4:
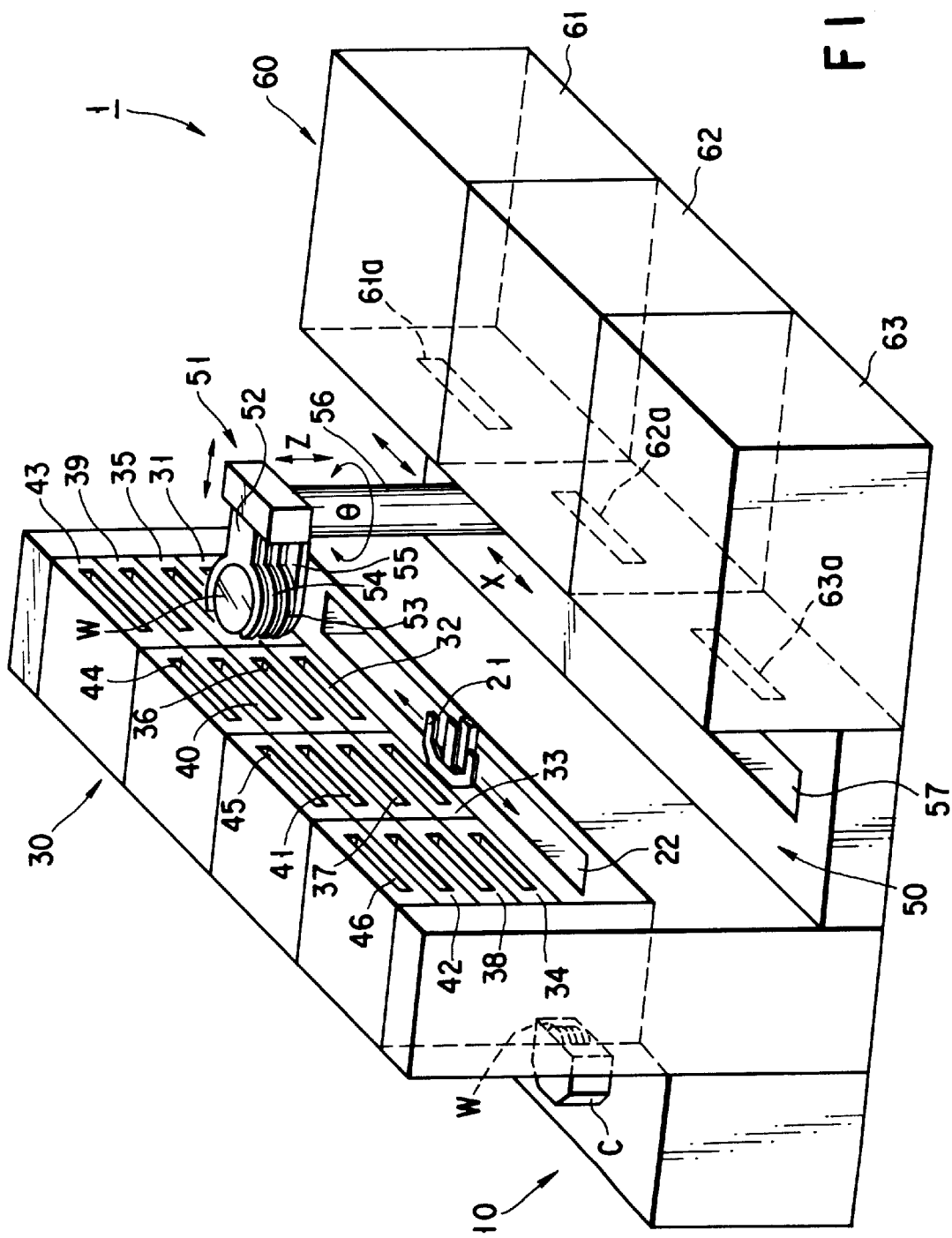
FIG. 4 is an oblique view showing the outer appearance of the substrate processing system according to the first embodiment of the present invention.

As shown in FIGS. 3 and 4, the heat treating devices forming the section 30 are housed in 16 compartments 31 to 46 positioned right above the first transfer zone 20. These 16 compartments consist of 4 compartment assemblies arranged side by side, each compartment assembly consisting of 4 compartments stacked one upon the other. An adhesion device for heating the wafer W is housed in the second uppermost compartment 39 included in the compartment assembly at the end on the right-hand side in FIG. 4 and baking devices are housed in the uppermost and second uppermost compartments 40 to 46 included in these compartment assemblies. On the other hand, cooling devices for cooling the wafer W are housed in the lowermost and second lowermost compartments 31 to 38 included in these compartment assemblies.

The liquid treating section 60 is arranged to face the heat treating section 30, with the second transfer zone 50 interposed therebetween. The section 60 consists of a washing device 61, a resist coating device 62 and developing devices 63A, 63B. These liquid treating devices 61, 62, 63A/63B are arranged side by side in this order. Incidentally, the developing device 63B is stacked on the developing device 63A. The washing device 61 is equipped with a spin chuck, a rotary brush and a pure water nozzle, and is constructed such that a pure water is applied to the wafer W, which is kept rotated, so as to subject the wafer W to a scrubber washing. The resist coating device 62 is equipped with a spin chuck and a resist solution nozzle, and is constructed such that a resist solution is applied to the surface of the wafer W, which is kept rotated, so as to coat the wafer W with the resist solution. Further, each of the developing devices 63A and 63B is equipped with a spin chuck and a developing solution nozzle, and is constructed such that a developing solution is applied to the resist coating, while rotating the wafer W.

Transfer ports 61a, 62a, 63a, 63b are formed in these solution treating devices 61, 62, 63A, 63B, respectively, in a manner to face the second transfer zone 50. The wafer W is transferred by the main arm mechanism 51 into and out of the liquid treating devices 61, 62, 63A, 63B through these transfer ports 61a, 62a, 63a, 63b, respectively. It should be noted that the baking devices housed in the upper compartments 40 to 46 are positioned higher than the washing device 61, the resist coating device 62 and the developing devices 63A, 63B.

The main arm mechanism 51 is provided with three holders 52, 53, 54 for directly holding the wafer W. These holders 52, 53, 54 are slidable along a base plate 55 and movable back and forth relative to the heat treating devices forming the section 30 and the liquid treating devices forming the section 60. The base plate 55 is supported by a vertical shaft 56 so as to be movable in a vertical direction. Also, the main arm mechanism 51 itself is swingable about a Z-axis. Further, since the first transfer path 22 and the second transfer path 57 are parallel with each other as described previously, the wafer W can be delivered between the sub-arm mechanism 21 and the main arm mechanism 51 anywhere on the transfer paths 22 and 57.

The interface section 70 is arranged in the vicinity of the developing device 63 and outside the second transfer zone 50 in the longitudinal direction of the zone 50. The interface section 70 is used when the wafer W is transferred between the substrate processing system 1 and a light exposure section (not shown).

The driving sections of the various treating devices, the main arm mechanism 51 and the sub-arm mechanism 21 included in the substrate processing system 1 are connected to an output section of a controller 75 for controlling the operations thereof. On the other hand, position detecting signals generated from various sensors (not shown) are supplied to the input section of the controller 75.

The substrate processing system 1 of the construction described above is operated as follows. Specifically, when the cassette C housing untreated wafers W is disposed on the cassette mounting section 10 by a transfer robot (not shown), the wafer W is taken out of the cassette C by the sub-arm mechanism 21 and positioned as desired. Then, the main arm mechanism 21 is moved in the directions of X-axis and Z-axis while being swung about the Z-axis so as to receive the wafer W from the sub-arm mechanism 21. It should be noted that the swinging about the Z-axis and movement in the directions of X-axis and Z-axis of the main arm mechanism 51 are performed in synchronism so as to permit the main arm mechanism 51 to be moved toward the sub-arm mechanism 21 in a short time.

The main arm mechanism 51 is further moved to face the washing device 61 so as to transfer the wafer W into the washing device 61 through the transfer port 61a. Within the washing device 61, the wafer W is scrubbed for the washing purpose. After the washing treatment, the wafer W is transferred by the main arm mechanism 51 into the baking device housed in the compartment 43 so as to be heated. Incidentally, if the transfer port of the compartment 43 is positioned to face the transfer port 6a of the washing device 61, movement of the main arm mechanism 51 in the X-axis direction can be omitted.

After the baking treatment, the wafer W is transferred by the main arm mechanism 51 into the compartment 31 housing the cooling device so as to cool the wafer W to about room temperature. Then, the wafer W is further transferred by the main arm mechanism 51 into the compartment 39 housing the adhesion device for applying an adhesion treatment to the wafer W.

After the adhesion treatment, the wafer W is transferred by the main arm mechanism 51 into the resist coating device 62 for coating the wafer W with a resist solution. Then, the wafer W is further transferred by the main arm mechanism 51 into the compartment 44 housing the baking device so as to be heated. As a result, the solvent is evaporated from the resist coating to form a desired resist film.

After the baking treatment, the wafer W is transferred by the main arm mechanism 51 into the compartment 32 housing the cooling device so as to be cooled to about room temperature. Further, the wafer W is disposed by the main arm mechanism 51 on a mounting table in the interface section 70 and, then, transferred by a transfer device (not shown) into a light-exposure section (not shown) so as to selectively expose the resist coating to light in a predetermined pattern. The wafer W after the light-exposure is brought back to the interface section 70.

After the light-exposure treatment, the wafer W is transferred by the main arm mechanism 51 into the developing device 63 so as to develop the pattern made by the selective light-exposure in the resist coating.

After the developing treatment, the wafer W is transferred by the main arm mechanism 51 into the compartment 42 housing the baking device so as to be heated. Then, the wafer W is transferred by the main arm mechanism 51 into the compartment 38 housing the cooling device so as to be cooled to about room temperature. Further, the wafer W is delivered from the main arm mechanism 51 onto the sub-arm mechanism 21 and, then, put in the cassette C by the sub-arm mechanism 21.

A series of treatments described above are simultaneously performed in parallel so as to allow a plurality of wafers W to be treated successively within the substrate processing system of the present invention.

In the embodiment described above, the compartments 40 to 46 housing the baking devices are positioned higher than the resist coating device 62, with the result that the resist coating device 62 is substantially prevented from being thermally affected by the baking devices. In addition, the compartments 31 to 38 housing the cooling devices are interposed between the compartments 40 to 46 housing the baking devices and the resist coating device 62. It follows that these compartments 31 to 38 effectively prevent the resist coating device 62 from being thermally affected by the baking devices housed in the compartments 40 to 46. Since the resist coating device 62 is not thermally affected, coating of a resist solution which is sensitive to temperatures can be performed satisfactorily. Likewise, the other solution treating devices 61, 63A and 63B are prevented from being thermally affected by the baking devices.

In the substrate processing system 1 of the embodiment described above, the heat treating section 30 is arranged above the first transfer path 22 so as to make the total floor area of the system 1 smaller than that in the conventional system.

Further, the first transfer path 22 and the second transfer path 57 extend in parallel with each other, making it possible to deliver the wafer W between the sub-arm mechanism 21 and the main arm mechanism 51 anywhere on the transfer paths 22 and 57. It follows that the time required for the wafer delivery can be shortened. In addition, the moving distances of the sub-arm mechanism 21 and the main arm mechanism 51 can also be shortened.

The arrangement of the washing device 61, the resist coating device 62 and the developing devices 63A, 63B is not limited to that in the embodiment described above. For example, these solution treating devices 61 and 62 may be stacked one upon the other. In this case, a plurality of liquid treating sections can be arranged within the same floor space, making it possible to process a larger number of wafers W with a high efficiency.

Figure 5:
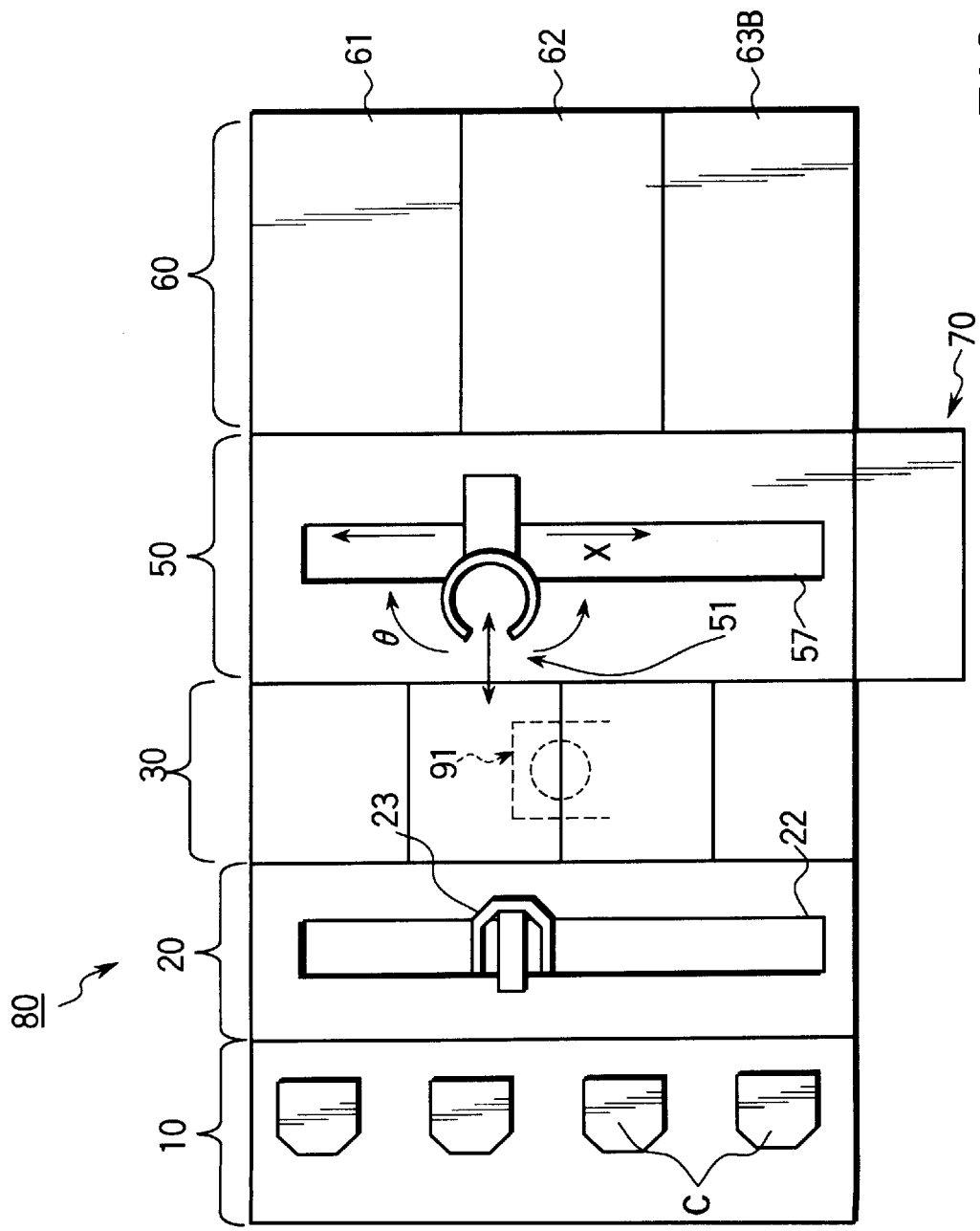
FIG. 5 is a plan view showing a substrate processing system according to a second embodiment of the present invention.
Figure 6:
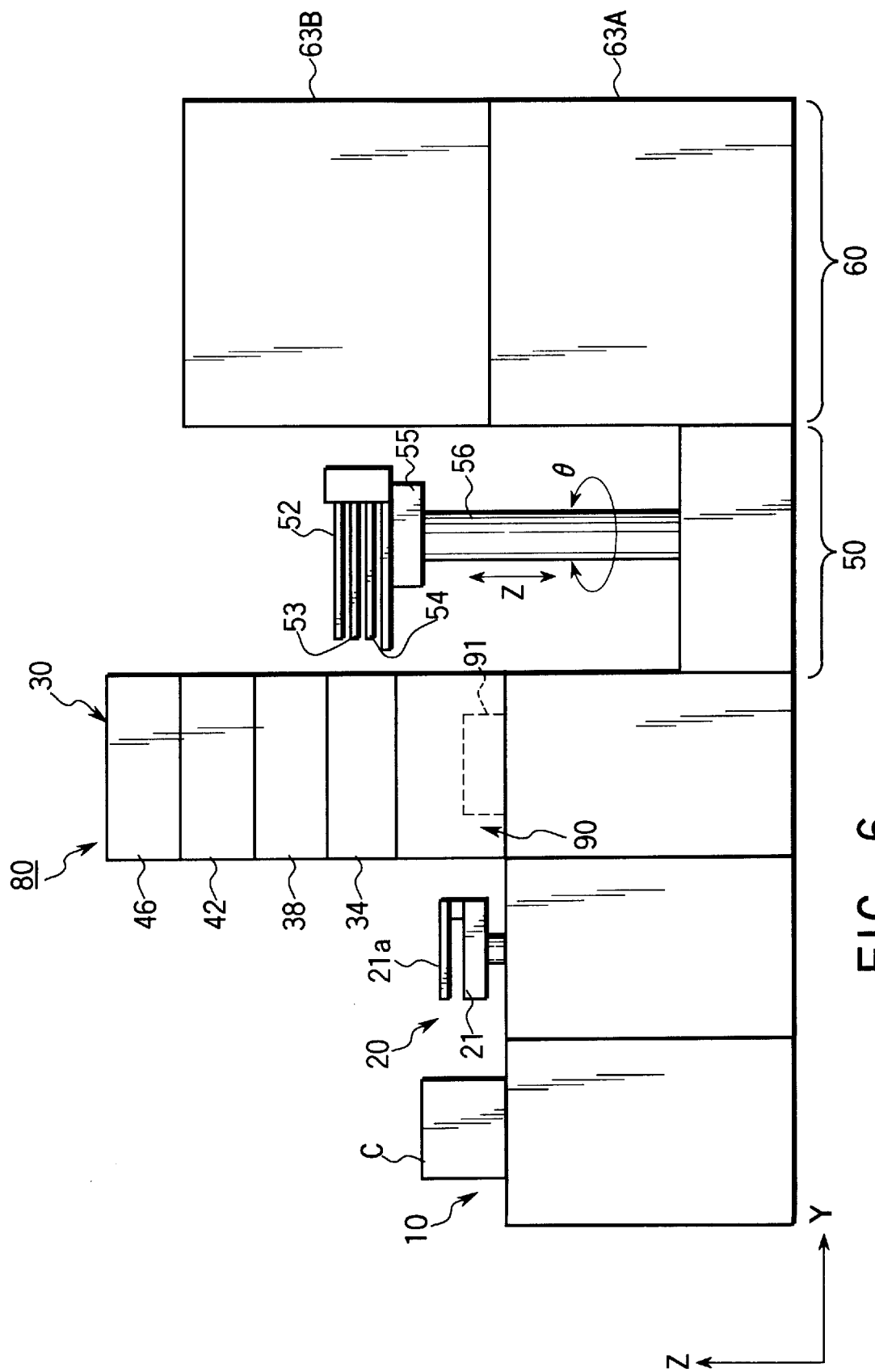
FIG. 6 is a side view showing the substrate processing system according to the second embodiment of the present invention.
Figure 7:
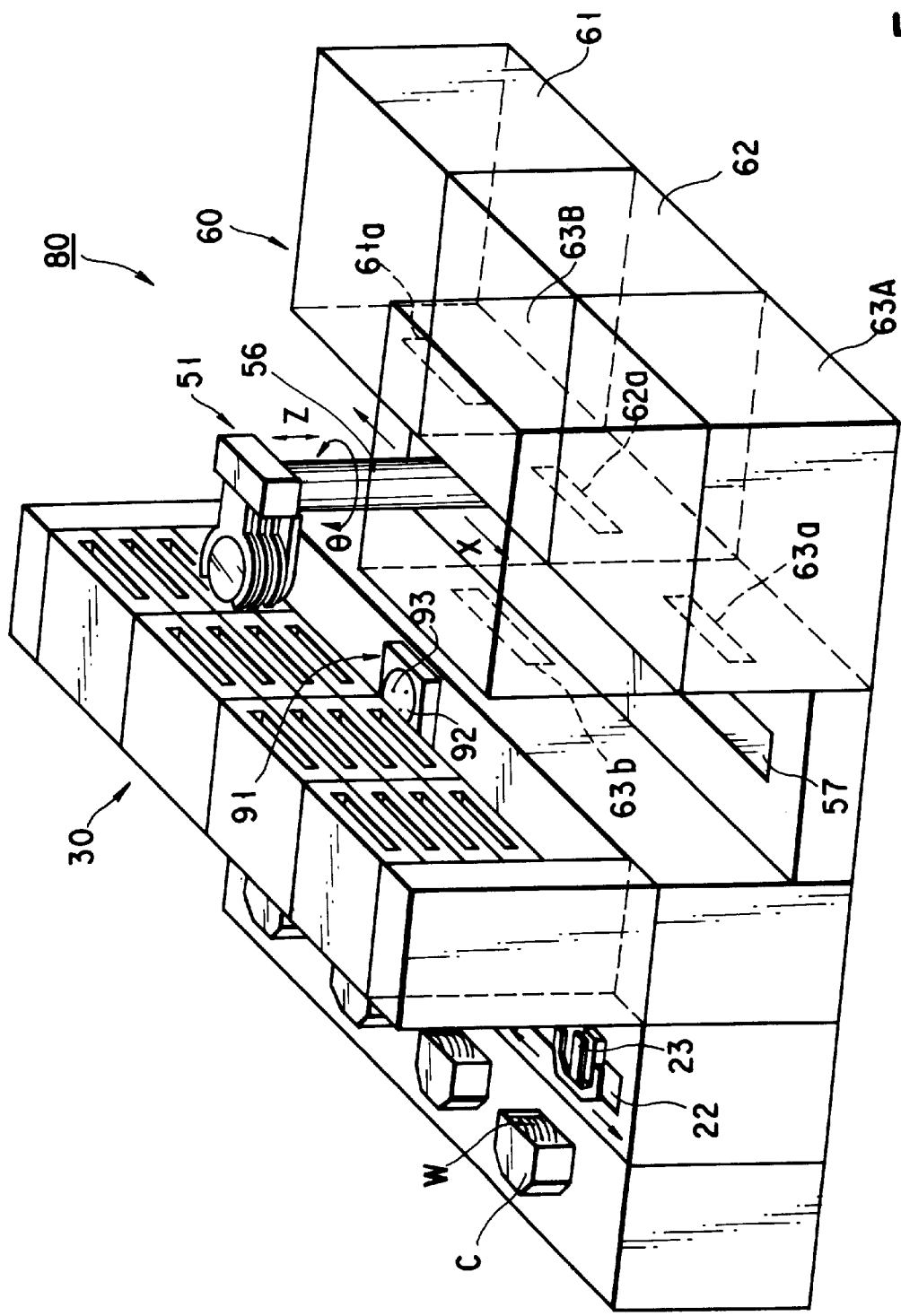
FIG. 7 is an oblique view showing the outer appearance of the substrate processing system according to the second embodiment of the present invention.

FIGS. 5 to 7 collectively show a substrate processing system 80 according to a second embodiment of the present invention. The overlapping portion with the first embodiment is omitted in the following description of the second embodiment.

In the system 80 of the second embodiment, a relay section 90 is interposed between the first transfer zone 20 and the second transfer zone 50 such that the wafer W is delivered between the sub-arm mechanism 21 and the main arm mechanism 51 via the relay section 90. Also, the heat treating section 30 is arranged above the relay section 90.

A stage 91 for delivering the wafer is included in the relay section 90. A mounting member 92 is disposed on the upper surface of the stage 91. Three supporting pins 93 project upward from the mounting member 92. Further, an alignment mechanism (not shown) is mounted in the stage 91 such that the wafer W is aligned on the stage 91 with the processing device.

Incidentally, it is possible to have the stage 91 supported by an X-axis moving mechanism (not shown) so as to move the stage 91 in the X-axis direction within the relay section 90. It is also possible to mount a cooling mechanism to the stage 91 for cooling the wafer W. Further, a plurality of stages 91 may be arranged in the X- or Y-axis direction or may be stacked one upon the other so as to permit a plurality of wafers W to be supported by the stages 91 simultaneously.

In the second embodiment of the construction described above, the location of the stage 91 can be selected as desired in view of the layout and recipe of the apparatus. As a result, the wafer delivery between the sub-arm mechanism 21 and the main arm mechanism 51 can be achieved promptly, leading to an improved through-put. Also, in the second embodiment, the relay section 90 can also be used as a temporary waiting position of the wafer W, making it possible to perform the wafer processing efficiently within each processing device included in the system 80.

Figure 8:
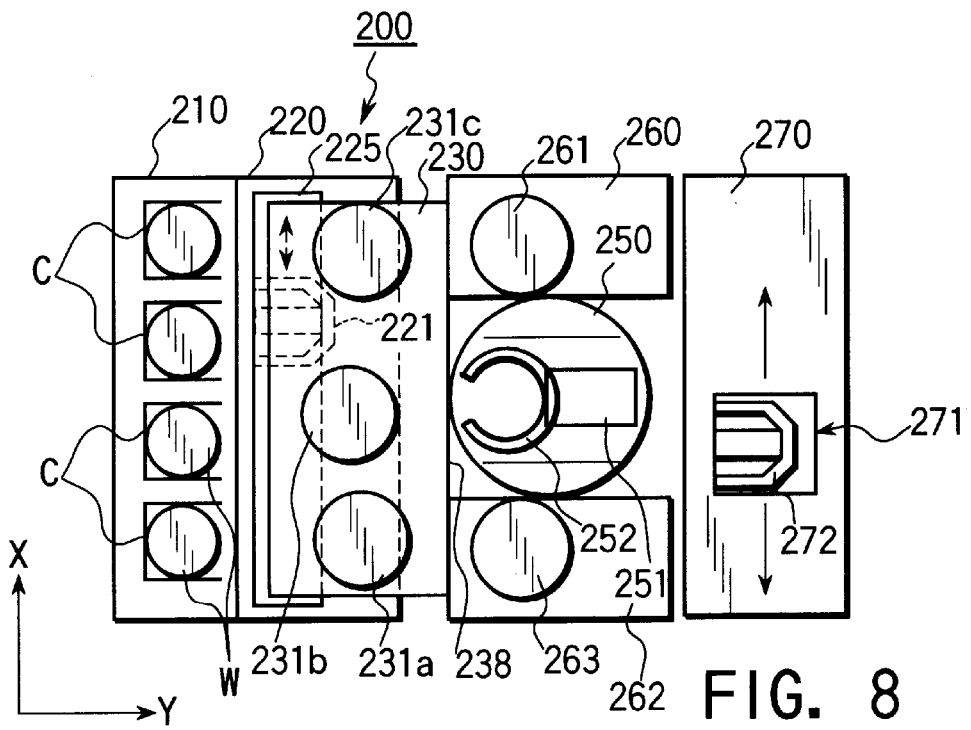
FIG. 8 is a plan view showing a substrate processing system according to a third embodiment of the present invention.
Figure 9:
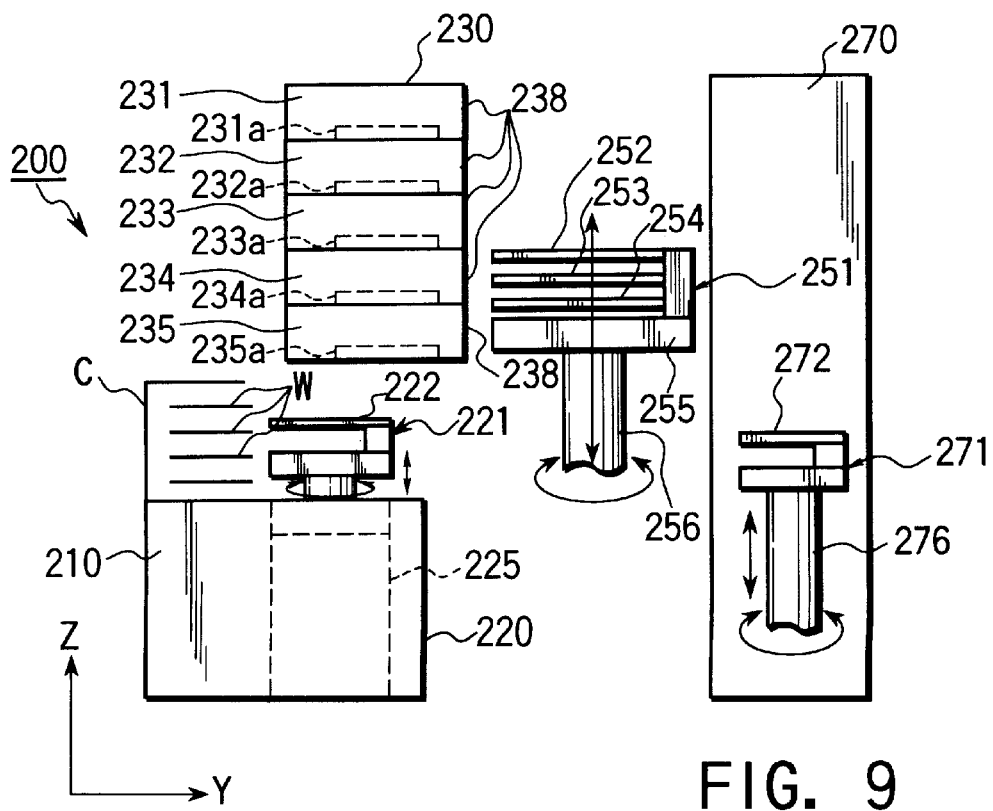
FIG. 9 is a side view showing the substrate processing system according to the third embodiment of the present invention.

FIGS. 8 and 9 collectively show a substrate processing system 200 according to a third embodiment of the present invention. The overlapping portion with the first and second embodiments is omitted in the following description of the third embodiment.

As shown in the drawings, the system 200 of the third embodiment, which is arranged in an air-conditioned clean room, comprises a cassette mounting section 210, a wafer delivery section 220, a heat treating section 230, liquid treating sections 260, 262, an interface section 270, a first transfer zone 220, a second transfer zone 250 and a third transfer zone 270. A first sub-arm mechanism 221 is arranged within the first transfer zone 220, and a main arm mechanism 251 within the second transfer zone 250. Also, a second sub-arm mechanism 271 is arranged within the third transfer zone (interface section) 270. Further, a light-exposure section (not shown) is arranged adjacent to the third transfer zone 270.

In the system 200 of the third embodiment, the main arm mechanism 251, which is not equipped with an X-axis moving means, is equipped with a Z-axis moving means, a swinging means about the Z-axis, and a holder moving means. The second transfer zone 250 of the main arm mechanism 251 extends along the Z-axis to enable the main arm mechanism 251 to transfer the wafer W in a vertical direction along the Z-axis.

The first sub-arm mechanism 221 is movable in an X-axis direction along a first transfer path 225 to take the wafers W one by one out of the cassette C arranged in the cassette mounting section 210. Four cassettes C are arranged in the cassette mounting section 210. One lot of wafers W consisting of 25 or 13 wafers is housed in each cassette C. These wafers W are taken out of the cassette C by the first sub-arm mechanism 221 and, then, delivered from the first sub-arm mechanism 221 onto the main arm mechanism 251. Further, the wafers W are successively transferred by the main arm mechanism 251 into the heat treating section 230 and the liquid treating sections 260, 262. Still further, the wafers W are transferred by the second sub-arm mechanism 271 into the light-exposure section (not shown). After completion of a series of these treatments, the wafers W are brought back into the cassette C.

The heat treating section 230 is arranged on the front side of the system 200 and above the first transfer zone 220. The first liquid treating section 260 is arranged on the left side of the second transfer zone 250. Further, the second liquid treating section 262 is arranged on the right side of the second transfer zone 250. Still further, the interface section 270 is arranged on the back side of the system 200. It follows that the main arm mechanism 251 is surrounded by the heat treating section 230, the first and second liquid treating sections 260, 262, and the interface section 270.

In the first liquid treating section 260, two spinner type resist coating units (COT) and a developing unit 261 are stacked one upon the other in the order mentioned such that the developing unit 261 constitutes the uppermost unit. Likewise, two spinner type resist coating units (COT) and a developing unit 263 are stacked one upon the other in the order mentioned such that the developing unit 263 constitutes the uppermost unit in the second liquid treating section 262. It is desirable for each of these resist coating units (COT) to be positioned lower than the developing unit 261 or 263 so as to facilitate discharge of the waste solution.

The heat treating section 230 comprises compartments 231, 232, 233, 234 and 235 which are stacked one upon the other. Three heat treating devices are arranged in each compartment. For example, baking devices 231*a*, 231*b*, 231*c* for heating the wafer W are arranged in the uppermost compartment 231.

Baking devices for heating the wafer W are arranged in the three upper compartments 231, 232, 233 included in the heat treating section 230. On the other hand, cooling devices for cooling the wafer W are arranged in the two lower compartments 234, 235. For example, cooling devices 235*a*, 235*b*, 235*c* are arranged in the lowermost compartment 235. Incidentally, it is possible for the heat treating section 230 to include an adhesion device (AD), an extension device (EXT), an extension cooling device (EXTCOL), and an alignment device (AL).

As described above, the cooling devices 234*a*, 234*b*, 234*c*, 235*a*, 235*b*, 235*c* each having a low treating temperature are arranged in the two lower compartments 234, 235, with the baking devices 231*a*, 231*b*, 231*c*, 232*a*, 232*b*, 232*c*, 233*a*, 233*b*, 233*c* each having a high treating temperature being arranged in the three upper compartments 231, 232, 233. As a result, it is possible to suppress the thermal interference between the baking devices and the cooling devices.

The main arm mechanism 251 is arranged inside a cylindrical supporting body (not shown) consisting of a pair of vertical walls facing each other and joined to each other at the upper and lower ends such that the holder moving portion of the main arm mechanism 251 is movable in a vertical direction along a Z-axis. Since the cylindrical supporting body is joined to the rotary shaft of a motor, the cylindrical supporting body and the holder moving portion of the main arm mechanism 251 are swung together. As a result, the holder moving portion is swingable about the Z-axis.

The holder moving portion includes a transfer base plate 255, an uppermost holder 252, an intermediate holder 253 and a lowermost holder 254. Each of these holders 252, 253, 254 is shaped and sized to be capable of passing through the side opening formed between the two vertical walls forming the cylindrical supporting body. Also, each of these holders is capable of moving forward and backward independently via a driving motor (not shown) mounted within the transfer base plate 255 and a belt (not shown).

The vertical distance between the uppermost holder 252 and the intermediate holder 253 is set larger than that between the intermediate holder 253 and the lowermost holder 254. It follows that it is possible to prevent the wafers W held by the uppermost and intermediate holders 252 and 253 from being adversely affected by the thermal interference with each other. Therefore, the uppermost holder 252 is used for transferring the wafer W from the cooling step to the resist coating step. On the other hand, the intermediate and lowermost holders 253 and 254 are used for transferring the wafers W which are unlikely to be adversely affected by the thermal interference. For improving the effect of preventing the thermal interference, a heat insulating plate (not shown) may be disposed between the uppermost holder 252 and the intermediate holder 253.

In each of the resist processing systems of the embodiments described above, a resist coating and development are applied to the wafer. However, the present invention is not limited to the system of this type. For example, the technical idea of the present invention can also be applied to a system including a solution treating device in which a predetermined solution is applied to a wafer which is kept rotated, a heating device for heating the wafer after application of the solution, an appropriate cooling device, a transfer mechanism, and a transfer means. Of course, the substrate itself to be treated is not limited to a semiconductor wafer. For example, a glass substrate for a liquid crystal display device can also be handled by the system of the present invention.

The substrate processing system of the present invention produces prominent effects, as summarized below. First of all, the transfer paths of the sub-arm mechanism and the main arm mechanism are arranged to extend in parallel with each other, making it possible to deliver the substrate from the sub-arm mechanism onto the main arm mechanism anywhere on the transfer paths. As a result, the moving distance of each of the sub-arm mechanism and the main arm mechanism can be shortened, leading to a shortened transfer time for delivering the substrate, and to an improved through-put. Further, the particle generation can be suppressed, compared with the conventional system.

It should also be noted that, since the transfer paths of the sub-arm mechanism and the main arm mechanism are arranged to extend in parallel, the substrate delivery position can be set at an optional point where the shortest substrate transfer time can be achieved.

Further, a group of the heat treating devices are arranged above the transfer path of the sub-arm mechanism, leading to a diminished floor space. As a result, the clean room housing the substrate processing system can be made smaller than in the past so as to lessen the burden given to the air conditioning facilities of the clean room.

Further, the substrate delivery point can be determined freely to make the moving distances of the sub-arm mechanism and the main arm mechanism shortest. Therefore, the substrate transfer time can be shortened by arranging appropriately the layout of the various treating devices included in the system so as to improve the through-put. Also, the delivery point can also be used as a waiting position of the wafer W so as to improve the treating efficiency in each treating device.

Still further, since a group of the heat treating devices are arranged above the substrate delivery point, the floor space of the system can be diminished so as to decrease the cost of the various facilities including the clean room.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A substrate processing system, comprising:
    a cassette mounting section having a plurality of cassettes arranged therein;
    a sub-arm mechanism for transferring the substrate into and out of the cassette within said cassette mounting section;
    a first transfer path of the sub-arm mechanism extending along the arrangement of the cassettes in the cassette mounting section;
    a process section including a heat treating section for heating and cooling the substrate and a liquid treating section in which a process liquid is applied to the substrate;
    a main arm mechanism for transferring the substrate from and onto the sub-arm mechanism and for transferring the substrate from and into the process section; and
    a second transfer path of the main arm mechanism,
    wherein said heat treating section is positioned higher than the first transfer path, interposed between the cassette mounting section and the second transfer path in respect of a horizontal plane, and comprises a plurality of compartments stacked one upon the other.

2. The substrate processing system according to claim 1, wherein said heat treating section is arranged above said first transfer path.

3. The substrate processing system according to claim 1, wherein said first and second transfer paths extend in a horizontal direction and arranged parallel with each other.

4. The substrate processing system according to claim 1, wherein said first transfer path extends in a horizontal direction and said second transfer path extends in a vertical direction.

5. The substrate processing system according to claim 1, wherein each of said first and second transfer paths extends straight.

6. The substrate processing system according to claim 1, wherein said liquid treating section is isolated from said heat treating section by the second transfer path.

7. The substrate processing system according to claim 1, wherein said liquid treating section is isolated from said cassette mounting section by the first and second transfer paths.

8. The substrate processing system according to claim 1, wherein a heating device for heating the substrate is housed within an upper compartment included in said heat treating section, and a cooling device for cooling the substrate is housed in a lower compartment.

9. The substrate processing system according to claim 8, wherein said upper compartments housing the heating devices are positioned higher than said liquid treating section.

10. The substrate processing system according to claim 8, wherein said upper compartments each housing the heating device are arranged adjacent to each other, and said lower compartments each housing the cooling device are arranged adjacent to each other.

11. The substrate processing system according to claim 1, wherein said liquid treating section comprises a plurality of compartments stacked one upon the other and a liquid processing device housed in each compartment for applying the process liquid to the substrate while rotating the substrate.

12. The substrate processing system according to claim 1, further comprising a relay section positioned below said heat treating section and interposed between the first and second transfer paths for assisting the delivery of the substrate from the sub-arm mechanism onto the main arm mechanism.

13. The substrate processing system according to claim 12, wherein a plurality of stages for supporting the substrate are arranged in said relay section in a direction parallel with the arranging direction of the cassettes in the cassette mounting section.

14. The substrate processing system according to claim 12, wherein said relay section is positioned right below the heating section.

15. The substrate processing system according to claim 1, wherein said sub-arm mechanism comprises a holder for holding the substrate, a vertical driving means for driving said holder in a Z-axis direction, a swing means for swinging the holder about the Z-axis, and a horizontal driving means for driving the holder within an XY plane.

* * * * *